(12) United States Patent
Sugitani (10) Patent No.: US 10,892,392 B2
(45) Date of Patent: Jan. 12, 2021

(54) METHOD FOR MANUFACTURING SEMICONDUCTOR DEVICE

(71) Applicant: NICHIA CORPORATION, Anan (JP)

(72) Inventor: Kyota Sugitani, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/555,648

(22) Filed: Aug. 29, 2019

(65) Prior Publication Data

US 2020/0075825 A1    Mar. 5, 2020

(30) Foreign Application Priority Data

Aug. 31, 2018 (JP) .................................. 2018-162883

(51) Int. Cl.
*H01L 33/62* (2010.01)
*H01L 33/22* (2010.01)
*H01L 33/00* (2010.01)

(52) U.S. Cl.
CPC ............ *H01L 33/62* (2013.01); *H01L 33/005* (2013.01); *H01L 33/22* (2013.01); *H01L 2933/0066* (2013.01)

(58) Field of Classification Search
CPC . H01L 33/62; H01L 33/22; H01L 2933/0066; H01L 33/0093; H01L 21/185; H01L 21/187; H01L 33/005
See application file for complete search history.

(56) References Cited

U.S. PATENT DOCUMENTS

| | | | |
|---|---|---|---|
| 2010/0096652 A1 | 4/2010 | Choi et al. | |
| 2010/0227421 A1 | 9/2010 | Neff et al. | |
| 2012/0007101 A1 | 1/2012 | Yang et al. | |
| 2012/0032218 A1 | 2/2012 | Choi et al. | |
| 2012/0074441 A1* | 3/2012 | Seo .......................... | H01L 33/46 257/91 |
| 2013/0277700 A1 | 10/2013 | Matsumura | |
| 2016/0225718 A1* | 8/2016 | Mischitz .................. | H05K 3/22 |
| 2016/0276540 A1 | 9/2016 | Miyabe et al. | |
| 2018/0190611 A1* | 7/2018 | Tatsumi .................. | H01L 24/32 |

FOREIGN PATENT DOCUMENTS

| | | |
|---|---|---|
| JP | 2010-103469 A | 5/2010 |
| JP | 2012-019217 A | 1/2012 |
| JP | 2012-519954 A | 8/2012 |
| JP | 2013-030759 A | 2/2013 |

(Continued)

*Primary Examiner* — Julia Slutsker (74) *Attorney, Agent, or Firm* — Foley & Lardner LLP (57) ABSTRACT

A method for manufacturing a semiconductor device includes: forming a first metal portion on a substrate, the first metal portion comprising a plurality of pores; preparing a structure body comprising a semiconductor stacked body, wherein a concave portion is provided in a first surface of the structure body; and bonding the first metal portion to the structure body, such that a first part of the first metal portion is bonded to the concave portion of the first surface, and a second part of the first metal portion is bonded to a part of the first surface other than a location where the concave portion is provided. In bonding the first metal portion to the structure body, the first metal portion is bonded to the first surface such that at least a portion of the concave portion is filled with the first metal portion.

19 Claims, 7 Drawing Sheets

(56) References Cited

FOREIGN PATENT DOCUMENTS

| | | | |
|---|---|---|---|
| JP | 2013-179215 | A | 9/2013 |
| JP | 2013-239699 | A | 11/2013 |
| JP | 2014-082336 | A | 5/2014 |
| JP | 2014-130981 | A | 7/2014 |
| JP | 2016-169411 | A | 9/2016 |
| JP | 2016-174018 | A | 9/2016 |

* cited by examiner

METHOD FOR MANUFACTURING SEMICONDUCTOR DEVICE

CROSS-REFERENCE TO RELATED APPLICATIONS

This application is based upon and claims priority to Japanese Patent Application No. 2018-162883, filed on Aug. 31, 2018, the entire contents of which are incorporated herein by reference.

BACKGROUND

Embodiments described herein relate generally to a method for manufacturing a semiconductor device.

There is a method for manufacturing a semiconductor device including a process of bonding two members. For example, the process of bonding may be a process in which a member having a concave portion provided in a surface of the member is bonded to another member. It is desirable to develop technology to simplify the process and reduce the manufacturing cost of a method for manufacturing a device including such a bonding process.

SUMMARY

According to one embodiment, a method for manufacturing a semiconductor device includes forming a first porous metal portion having pores on a substrate. The method further includes a first preparation process of preparing a structure body including a semiconductor stacked body. A concave portion is provided in a first surface of the structure body. The method further includes a bonding process of bonding the first metal portion to the structure body to bond a portion of the first metal portion to the concave portion and to bond an other portion of the first metal portion to a surface other than where the concave portion is provided. The first metal portion is bonded to the first surface to fill at least a portion of the concave portion with the first metal portion and cause an average diameter of the pores in the other portion to be smaller than an average diameter of the pores in the portion.

The present disclosure provides a method for manufacturing a semiconductor device capable of simplifying the manufacturing process and reducing manufacturing cost.

DETAILED DESCRIPTION

Embodiments of the invention will now be described with reference to the drawings. The same components in the drawings are marked with the same reference numerals.

FIG. 1A to FIG. 1H are process cross-sectional views showing a method for manufacturing a semiconductor device according to a first embodiment of the invention.

Figure 1A:
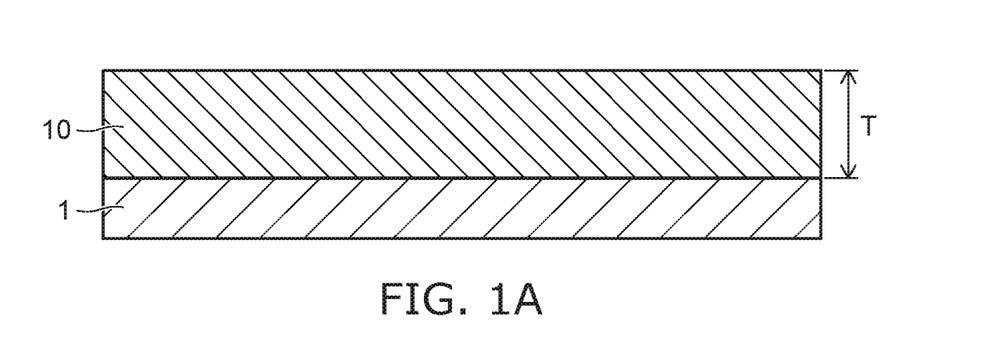
FIG. 1A to FIG. 1H are cross-sectional views showing a method for manufacturing a semiconductor device according to a first embodiment of the invention.

First, as shown in FIG. 1A, a metal layer 10 is formed on a substrate 1 (a second preparation process). The metal layer 10 includes an alloy including a first metal and a second metal. At least a portion of the alloy included in the metal layer 10 includes a portion made of the first metal and a portion made of the second metal, not as a solid solution or a eutectic.

For example, the metal layer 10 is formed by vacuum vapor deposition using the alloy including the first metal and the second metal as an evaporation source. The metal layer 10 may be formed by simultaneously vaporizing or sublimating an evaporation source made of the first metal and an evaporation source made of the second metal. Alternatively, plating, sputtering, or the like may be used as the method for forming the metal layer 10.

Figure 1B:
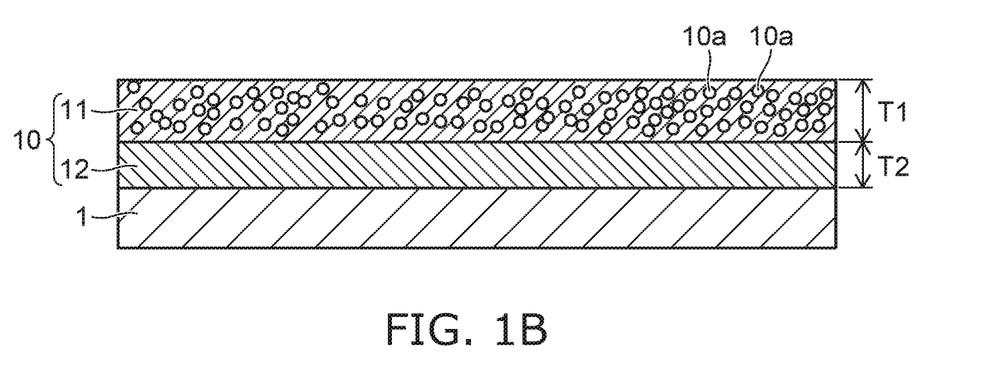

Then, the second metal that is included in at least a portion of the metal layer 10 is removed. Thereby, pores are formed in portions inside the metal layer 10 where the second metal existed. As a result, as shown in FIG. 1B, a porous first metal portion 11 that has multiple pores 10a is formed in the metal layer 10 (a formation process). In the case in which only a portion of the second metal of the metal layer 10 is removed, as shown in FIG. 1B, the first metal portion 11 that is made of the first metal is formed, and a second metal portion 12 that is made of the first metal and the second metal is formed. The second metal portion 12 is positioned between the substrate 1 and the first metal portion 11.

More specifically, the multiple pores 10a communicate with each other inside the first metal portion 11, and a hollow that spreads three-dimensionally inside the first metal portion 11 is formed. When the metal layer 10 is viewed in some cross section, a portion of the hollow appears to be interspersed multiple pores 10a.

For example, the second metal inside the metal layer 10 is removed by wet etching. The chemical liquid that is used in the wet etching can selectively remove the second metal with respect to the substrate 1 and the first metal. For example, the substrate 1 includes Si, CuW, etc. The first metal is at least one selected from the group consisting of gold, silver, nickel, and chrome. It is favorable for the second metal to be tin. Nitric acid can be used as the chemical liquid of the wet etching in the case in which these materials are used.

Figure 1C:
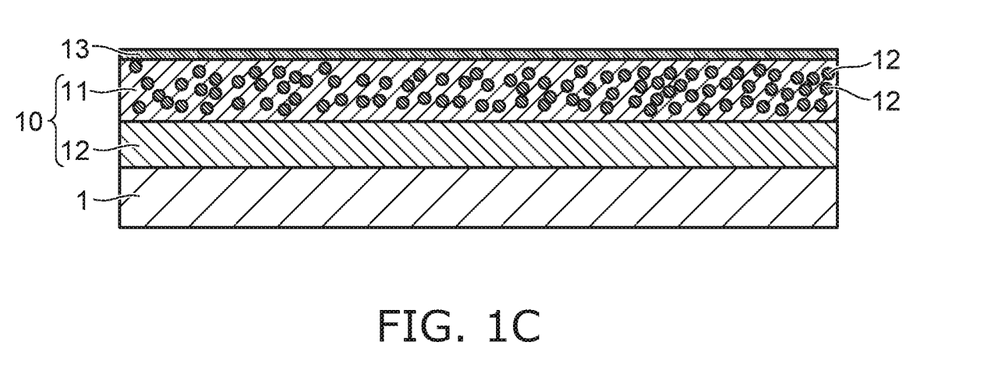

Continuing as shown in FIG. 1C, a first bonding layer 13 that is used to bond to a structure body 20 described below is formed on the first metal portion 11. The first bonding layer 13 may be a single layer or may have a stacked structure. As an example, the first bonding layer 13 is formed by stacking a platinum layer, a titanium layer, a nickel layer, and a tin layer in this order. It is also possible to omit the process of forming the first bonding layer 13 if the first metal included in the first metal portion 11 is a material suited to bonding.

Figure 1D:
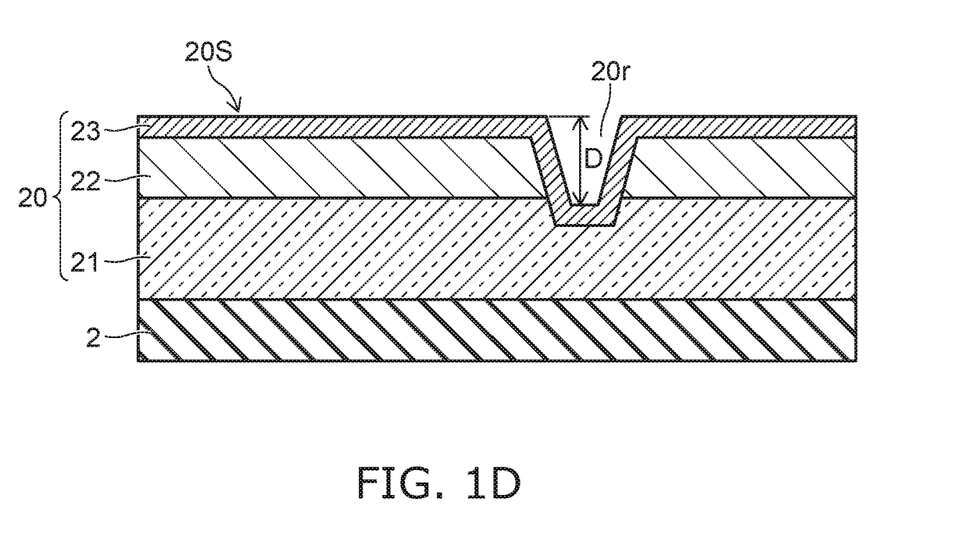

The structure body 20 shown in FIG. 1D is prepared separately from the first metal portion 11 (a first preparation process). The structure body 20 is provided on a substrate 2 and includes a semiconductor stacked body 21, a stacked body 22, and a second bonding layer 23. The structure body 20 also has a first surface 20S where a concave portion 20r is provided.

The semiconductor stacked body 21 is provided on the substrate 2. The substrate 2 is, for example, a sapphire substrate. The semiconductor stacked body 21 includes multiple layers made of a semiconductor material such as silicon, gallium nitride, gallium arsenide, silicon nitride, etc. In the case in which a sapphire substrate is used as the substrate 1, it is favorable for the semiconductor stacked body 21 to be a semiconductor material made of a nitride semiconductor such as $In_XAl_YGa_{1-X-Y}N$ (0≤X, 0≤Y, and X+Y<1), etc. An impurity may be added to each semiconductor layer included in the semiconductor stacked body 21.

In a plan view, the stacked body 22 is provided at the surface of the semiconductor stacked body 21 overlapping a region where the concave portion 20r is not provided. The stacked body 22 includes, for example, at least one insulating layer and at least one metal layer.

The second bonding layer 23 is provided along the first surface 20S. In other words, the second bonding layer 23 is provided at the upper surface of the stacked body 22 and the side surface and the bottom surface of the concave portion 20r. The second bonding layer 23 is used to bond to the first metal portion 11. The second bonding layer 23 may be a single layer or may have a stacked structure. A titanium layer, a nickel layer, and a tin layer are stacked in this order as an example of the stacked structure of the second bonding layer 23. The structure body 20 may not include the second bonding layer 23 if a metal layer that is suited to bonding is provided at the surface of the stacked body 22.

Figure 1E:
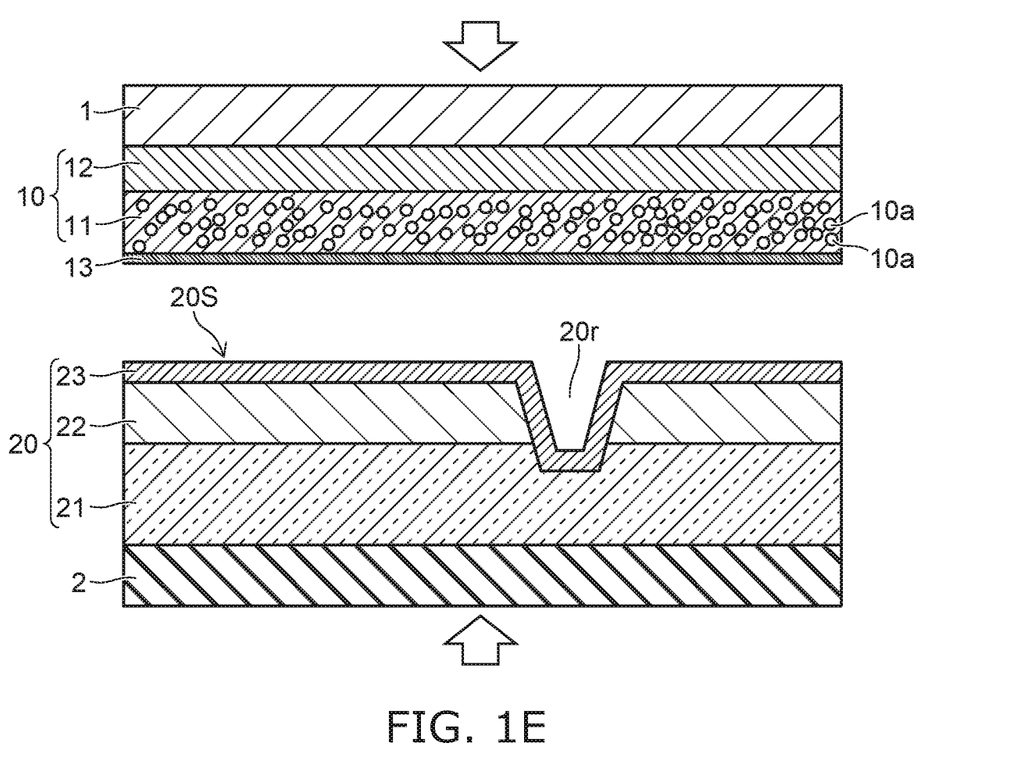
Figure 1F:
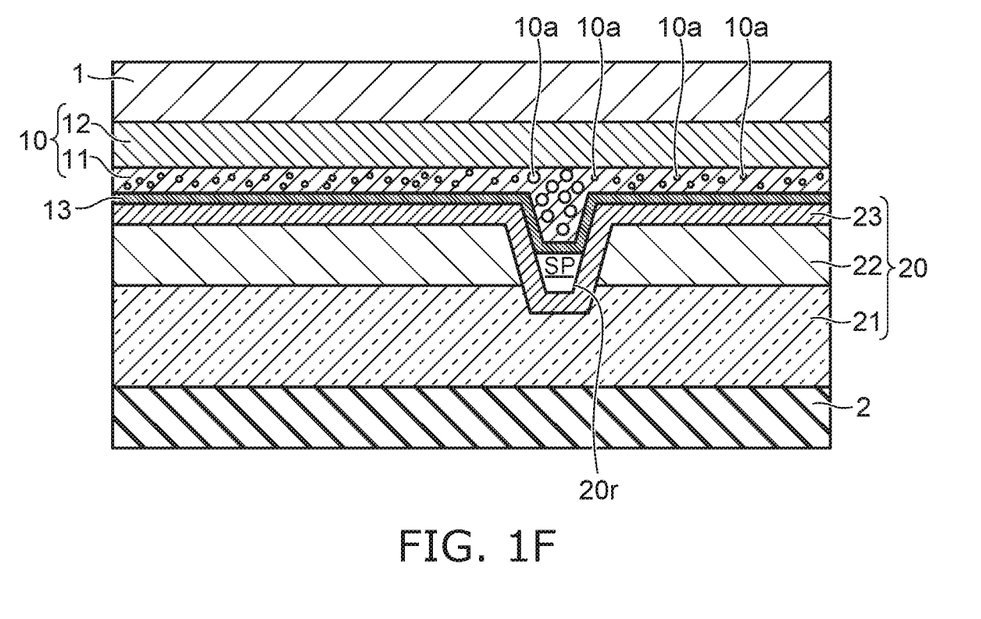

Then, as shown in FIG. 1E, the first metal portion 11 is bonded to the first surface 20S of the structure body 20. The bonding is performed by heating while pressing the surface of the substrate 1 where the metal layer 10 is provided and the surface of the substrate 2 where the structure body 20 is provided toward each other. Thereby, as shown in FIG. 1F, a first part of the first metal portion 11 is bonded to the concave portion 20r of the first surface 20S, and a second part of the first metal portion 11 is bonded to a surface of the first surface 20S at a location other than where the concave portion 20r is provided.

The first metal portion 11 that contacts the first surface 20S of the structure body 20 is porous. Therefore, the first metal portion 11 is softer than the second metal portion 12 and the other metal layers such as the first bonding layer 13, the second bonding layer 23, etc., and deforms easily according to the configuration of the first surface 20S when contacting the first surface 20S. Accordingly, when the second part of the first metal portion 11 contacts the first surface 20S at the location other than the concave portion 20r of the first surface 20S, the pores 10a are contracted and the configuration of the first metal portion 11 changes. On the other hand, at the concave portion 20r of the first surface 20S, the portion of the first metal portion 11 enters the concave portion 20r without the pores being contracted very much.

As a result, the average diameter of the pores 10a in the second part of the first metal portion 11 is smaller than the average diameter of the pores 10a in the first part of the first metal portion 11.

For example, the average diameter of the pores 10a is measured by the following method. First, after being bonded to the structure body 20, the metal layer 10 is cut in a cross section including the concave portion 20r along the direction in which the structure body 20 and the metal layer 10 overlap. Then, in the cross section, the average value of the diameters of the pores 10a inside a prescribed surface area is calculated for the portion of the first metal portion 11 provided inside the concave portion 20r and the portion of the first metal portion 11 provided outside the concave portion 20r. If the pore is not circular, the maximum dimension of the pore in the cross section along a direction connecting the metal layer 10 and the structure body 20 (the thickness direction of the metal layer 10) is used as the diameter of the pore. The calculated average value is used as the average diameter of the pores 10a in each portion.

Because the other portion of the first metal portion 11 is contracted, for example, the density of the pores 10a in the other portion of the first metal portion 11 is lower than the density of the pores 10a in the portion of the first metal portion 11.

For example, the densities of the pores 10a in the portion and the other portion of the first metal portion 11 are measured by the following method. Similarly to the method for measuring the average diameter of the pores 10a described above, the cross section of the first metal portion 11 and the structure body 20 is observed at a position including the concave portion 20r. Then, in the cross section, the total proportion of the surface area of the pores 10a inside the prescribed surface area is calculated for the portion of the first metal portion 11 provided inside the concave portion 20r and the portion of the first metal portion 11 provided outside the concave portion 20r. The proportion is used as the density of the pores 10a.

Figure 1G:
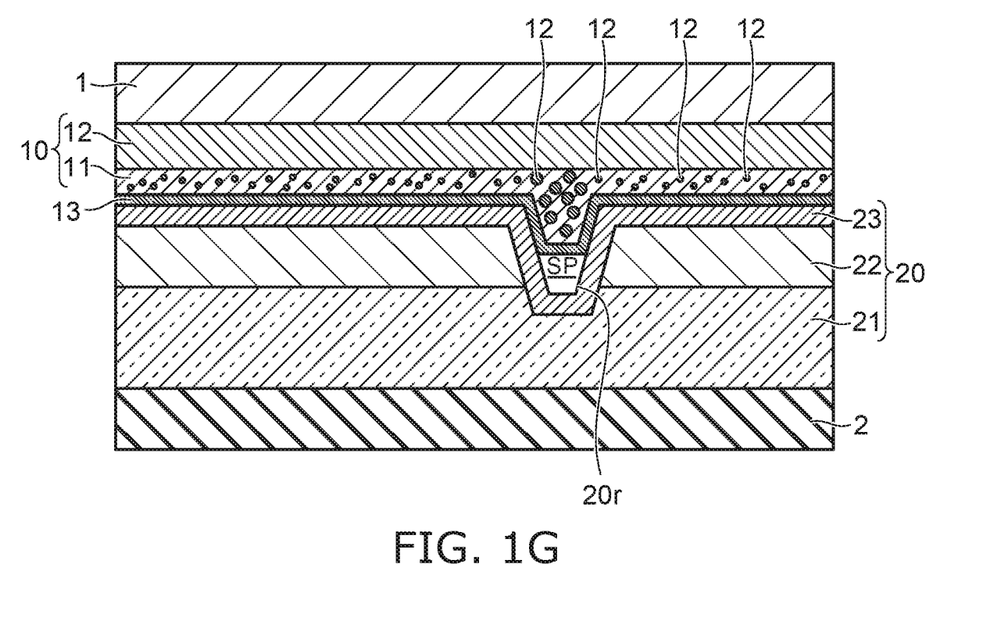

Due to the heat applied in the bonding, there are cases where the second metal portion 12 of the metal layer 10 melts and flows into at least a portion of the pores 10a of the first metal portion 11. In such a case, as shown in FIG. 1G, the structure includes multiple second metal portions 12 that are made of the first metal and the second metal and provided inside the first metal portion 11 made of the first metal. In such a case, for example, the average diameter of the second metal portions 12 in the other portion of the first metal portion 11 is smaller than the average diameter of the second metal portions 12 in the portion of the first metal portion 11, The average diameter of the second metal portions 12 inside the first metal portion 11 can be determined by a method similar to the method for calculating the average diameter of the pores described above. Also, the density of the second metal portions 12 in the other portion of the first metal portion 11 is lower than the density of the second metal portions 12 in the portion of the first metal portion 11.

Figure 1H:
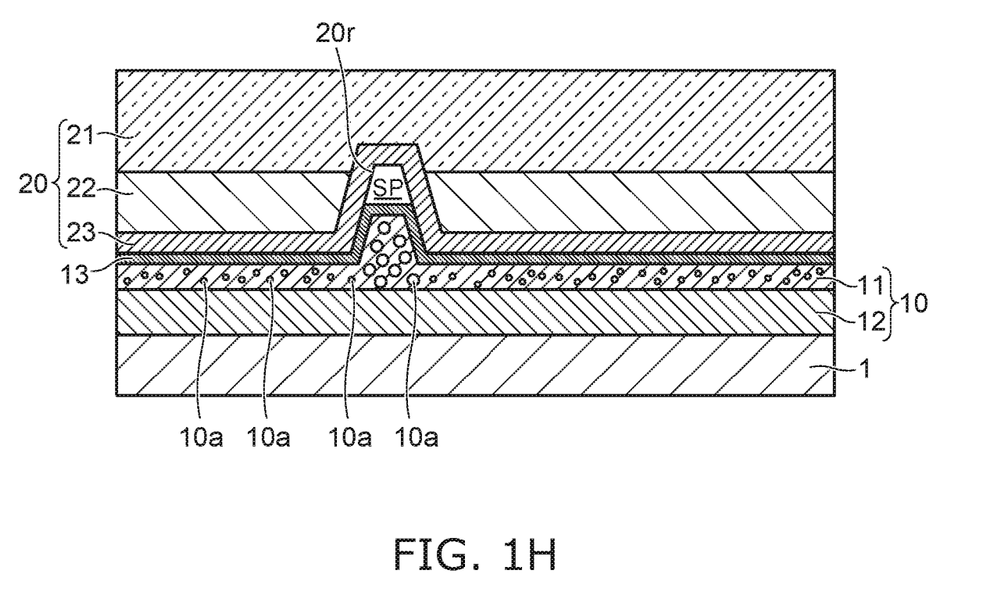

In the bonding, the first metal portion 11 is filled into a portion of the concave portion 20r; and a space SP that is surrounded with the first surface 20S and the first metal portion 11 or the first bonding layer 13 may be formed at the concave portion 20r as shown in FIG. 1F and FIG. 1G, For example, the bonding process is performed in a space having a pressure set to be less than atmospheric pressure. Accordingly, if the space SP is formed, the pressure of the space SP also is less than atmospheric pressure. As shown in FIG. 1H, the substrate 2 on the structure body 20 side may be removed after the bonding.

Effects of the embodiment will now be described with reference to a comparative example.

The following is an example of a manufacturing method according to the comparative example. First, the first bonding layer 13 is formed on the metal layer 10 without forming the first metal portion 11. A thick metal film for filling the concave portion is formed on the first surface 20S of the structure body 20 on which the second bonding layer 23 is not provided. Then, the surface of the metal film is planarized by polishing. Continuing, the second bonding layer 23 is formed on the surface of the planarized metal film. Subsequently, the metal layer 10 and the structure body 20 are bonded by bonding the first bonding layer 13 and the second bonding layer 23.

According to this method, the bonding between the metal layer 10 and the structure body 20 is easy because the concave portion 20r is filled with the metal film. Also, because the concave portion 20r is filled, the heat dissipation of the semiconductor device that is manufactured also improves. On the other hand, this method increases the manufacturing cost due to the high number of processes. For example, a relatively thick metal film must be formed to fill the concave portion 20r if the concave portion 20r is deep. Therefore, the manufacturing cost increases further due to the long period of time necessary for the process of forming the metal film and the process of planarizing the metal film.

In the method for manufacturing the semiconductor device according to the embodiment as shown in FIG. 1E, the porous first metal portion 11 is bonded to the first surface 20S of the structure body 20. Specifically, the first part of the first metal portion 11 is bonded to the concave portion 20r of the first surface 20S, and the second part of the first metal portion 11 is bonded to the surface of the first surface 20S at a location other than where the concave portion 20r is provided.

At this time, the first metal portion 11 deforms easily according to the configuration of the first surface 20S when bonding because the first metal portion 11 is porous. Therefore, in the bonding, at least a portion of the concave portion 20r is filled with the first metal portion 11, and the average diameter of the multiple pores 10a in the second part of the first metal portion 11 is smaller than the average diameter of the multiple pores 10a in the first part of the first metal portion 11.

In other words, according to the method for manufacturing the semiconductor device according to the embodiment, it is possible to fill at least a portion of the concave portion 20r with the first metal portion 11 even though a metal film is not formed to fill the concave portion 20r. Therefore, the decrease of the bondability and/or the heat dissipation can be suppressed even if the metal film is not formed. The manufacturing cost of the semiconductor device can be reduced thereby, because the process of forming the thick metal film and the process of planarizing the metal film are unnecessary.

Further, because the first metal portion 11 deforms easily when contacting the first surface 20S, the load that is applied to the substrate 1 and the substrate 2 when bonding can be reduced. Therefore, the damage of the substrate 1, the substrate 2, the structure body 20, etc., when bonding can be suppressed, and the yield of the semiconductor device can be increased.

As described above, according to the method for manufacturing the semiconductor device according to the first embodiment, the decrease of the manufacturing cost and the increase of the yield can be realized while suppressing the decrease of the bondability and the heat dissipation.

In the formation process of forming the first metal portion 11 as shown in FIG. 1B, it is desirable to form the first metal portion 11 so that a thickness T1 of the first metal portion 11 is greater than a thickness T2 of the second metal portion 12. By setting the thickness T1 to be greater than the thickness T2, the concave portion 20r can be filled with the first metal portion 11 easily while reducing the thickness of the metal layer 10; the time necessary for forming the metal layer 10 in the process shown in FIG. 1A can be shortened; and the manufacturing cost can be reduced.

In the process of bonding the first metal portion 11 and the first surface 20S as shown in FIG. 1G, it is desirable for the first metal and the second metal to fill at least a portion of the pores of the first metal portion 11. By filling the first metal and the second metal into the pores of the first metal portion 11, the thermal conductivity of the first metal portion 11 can be improved, and the heat dissipation of the semiconductor device that is manufactured can be improved.

It is desirable for the metal layer 10 to be formed so that a thickness T of the metal layer 10 (shown in FIG. 1A) is greater than a depth D of the concave portion 20r (shown in FIG. 1D). Here, the thickness T of the metal layer 10 is the thickness in the stacking direction of the metal layer 10. The depth D of the concave portion 20r is the distance in the stacking direction between the surface of the first surface 20S above the stacked body 22 and the surface of the first surface 20S above the semiconductor stacked body 21 where the stacked body 22 is not provided. Because the thickness T is greater than the depth D, the first metal portion 11 that has a sufficient thickness can be formed in the metal layer 10. Accordingly, the volume of the first metal portion 11 provided inside the concave portion 20r when bonding can be larger, and the heat dissipation and the bondability between the first metal portion 11 and the first surface 20S can be improved.

As described above, metal materials are used as the first metal and the second metal, so that the second metal can be removed selectively with respect to the first metal. It is desirable for the first metal to be at least one selected from the group consisting of gold, silver, nickel, and chrome, and for the second metal to be tin. By using these materials, the melting point of the second metal portion 12 including the first metal and the second metal can be much lower than when the second metal portion 12 includes one of the first metal or the second metal. Accordingly, even if the heating temperature is low when bonding, the second metal portion 12 can be melted, and the first metal portion 11 and the structure body 20 can be bonded using the melted second metal portion 12. Therefore, the damage of the metal layer 10 and/or the structure body 20 due to the heat when bonding can be reduced.

It is desirable to form the space SP surrounded with the first surface 20S and the first metal portion 11 at the concave portion 20r when bonding the first metal portion 11 to the first surface 20S. If the first metal portion 11 is filled into the concave portion 20r down to the bottom portion, a large stress is generated at the contact portion between the first metal portion 11 and the semiconductor stacked body 21 when the first metal portion 11 expands or contracts due to the heat of the semiconductor device. When film separation or the like occurs at the contact portion between the first metal portion 11 and the semiconductor stacked body 21, the heat dissipation characteristics and the electrical characteristics fluctuate between the manufactured semiconductor devices. By forming the space SP, the stress at the contact portion between the first metal portion 11 and the semiconductor stacked body 21 can be reduced; and such characteristic fluctuation can be suppressed.

It is desirable for the pressure in the space SP to be lower than atmospheric pressure. When the pressure in the space SP is not less than atmospheric pressure, the expansion amount is large when the gas inside the space SP is heated. Thereby, a large stress is generated in the semiconductor device from the space SP toward the exterior space; and the semiconductor device may be damaged. By setting the pressure of the space SP to be less than atmospheric pressure, the likelihood of such problems occurring can be reduced.

Application Example

The method for manufacturing the semiconductor device according to the embodiment is widely applicable to methods for bonding two members in which a concave portion is provided in the surface of one of the members. Here, as an example, a case will be described where the manufacturing method according to the embodiment is applied to a method for manufacturing a semiconductor light-emitting device.

Figure 2A:
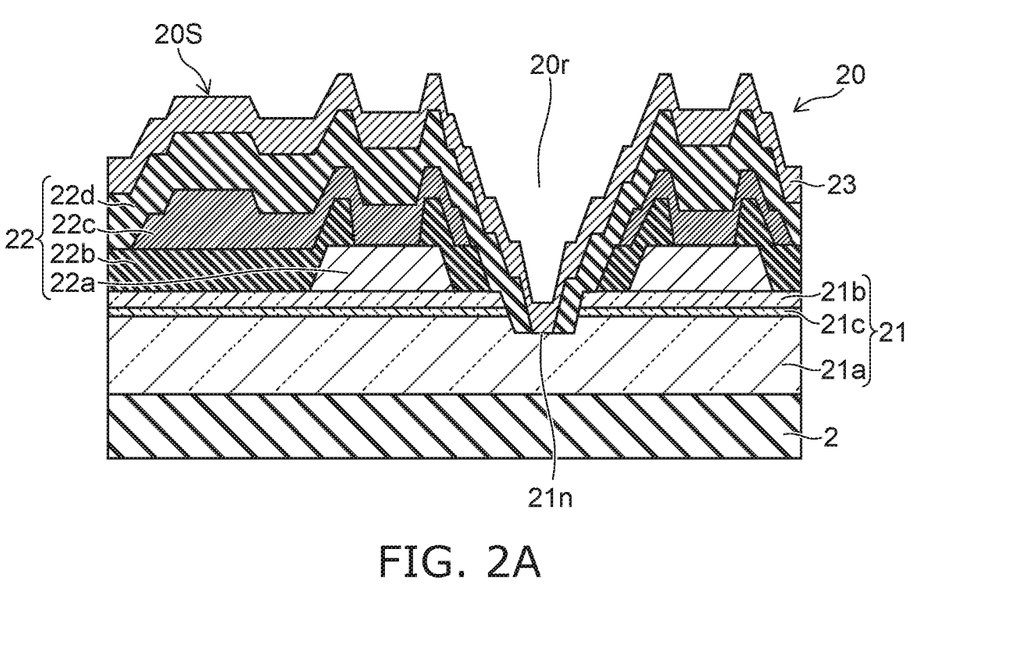
FIG. 2A and FIG. 2B are cross-sectional views showing an application example of the method for manufacturing the semiconductor device according to the first embodiment of the invention.
Figure 2B:
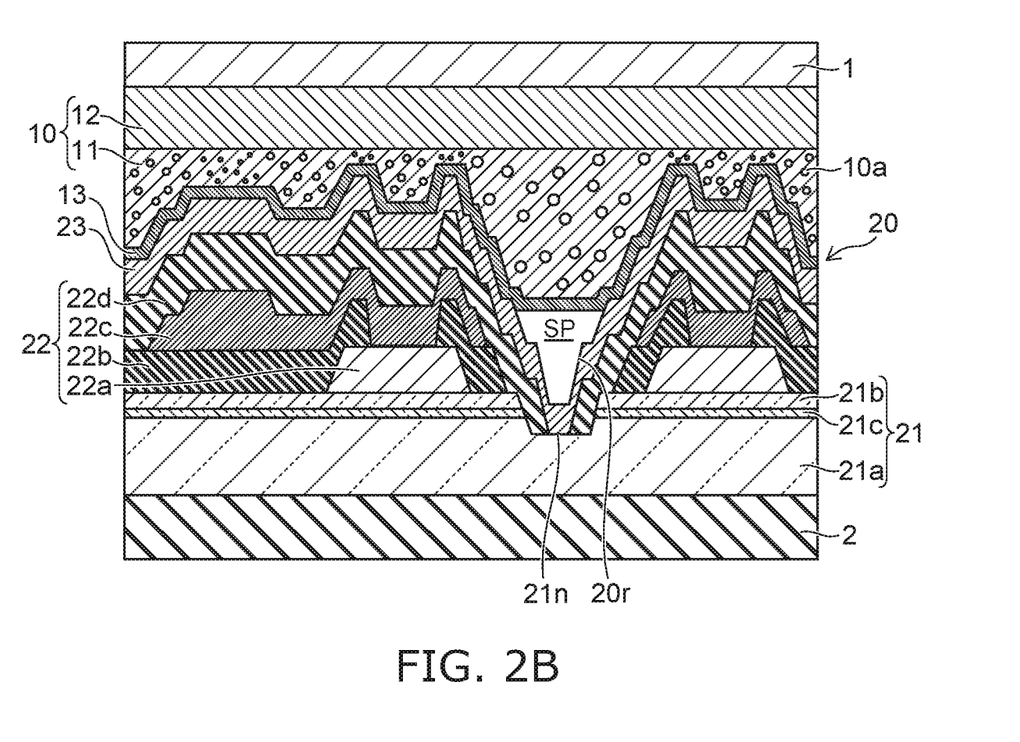

FIG. 2A and FIG. 2B are process cross-sectional views showing an application example of a method for manufacturing a semiconductor device according to the first embodiment of the invention.

The structure of the structure body 20 when manufacturing the semiconductor light-emitting device using the manufacturing method according to the embodiment is shown in FIG. 2A.

The semiconductor stacked body 21 includes an n-type semiconductor layer 21a, a p-type semiconductor layer 21b, and a light-emitting layer 21c. The n-type semiconductor layer 21a is provided at the substrate 2 side of the semiconductor stacked body 21. The light-emitting layer 21c is provided between the n-type semiconductor layer 21a and the p-type semiconductor layer 21b. The p-type semiconductor layer 21b and the light-emitting layer 21c are provided at the surface of the n-type semiconductor layer 21a overlapping a region where the concave portion 20r is not provided in a plan view.

The stacked body 22 includes a p-side electrode 22a, an insulating layer 22b, an interconnect layer 22c, and an insulating layer 22d. The p-side electrode 22a is provided partially on the p-type semiconductor layer 21b around the concave portion 20r. The insulating layer 22b covers the outer perimeter of the p-side electrode 22a and the surface of the p-type semiconductor layer 21b so that the interconnect layer 22c contacts only the p-side electrode 22a. The interconnect layer 22c is provided on the p-side electrode 22a and the insulating layer 22b and is connected to the p-side electrode 22a via an opening provided in the insulating layer 22b. The insulating layer 22d covers the surface of the interconnect layer 22c and the p-type semiconductor layer 21b and the light-emitting layer 21c exposed at the side surface of the concave portion 20r.

The second bonding layer 23 is provided along the surface of the insulating layer 22d. A portion of the n-type semiconductor layer 21a is not covered with the insulating layer 22d and is exposed at the bottom portion of the concave portion 20r. The portion of the n-type semiconductor layer 21a contacts the second bonding layer 23 and forms a contact surface 21n.

Examples of the materials of the components included in the structure body 20 will now be described.

The semiconductor stacked body 21 includes a nitride semiconductor layer. The p-side electrode 22a and the interconnect layer 22c include a metal material such as titanium, nickel, etc. The insulating layer 22b and the insulating layer 22d include an insulating material such as silicon oxide, etc.

The structure shown in FIG. 2B is obtained by bonding the structure body 20 shown in FIG. 2A to the first metal portion 11 shown in FIG. 1C and subsequently removing the substrate 2. Other than the concave portion 20r, many uneven portions that have height differences smaller than that of the concave portion 20r exist in the first surface 20S, and the configuration of the first metal portion 11 changes according to these uneven portions. Thereby, the first metal portion 11 and the structure body 20 can be bonded appropriately even in regions other than the concave portion 20r, and the heat dissipation of the semiconductor light-emitting device that is manufactured can be improved.

For example, the average diameter of the pores 10a in the first metal portion 11 after bonding changes according to the configuration of the first surface 20S. As an example as shown in FIG. 2B, the average diameter of the pores 10a after bonding is small at the portions bonded to the protrusions of the first surface 20S and is large at the portion bonded to the concave portion of the first surface 20S.

Figure 3:
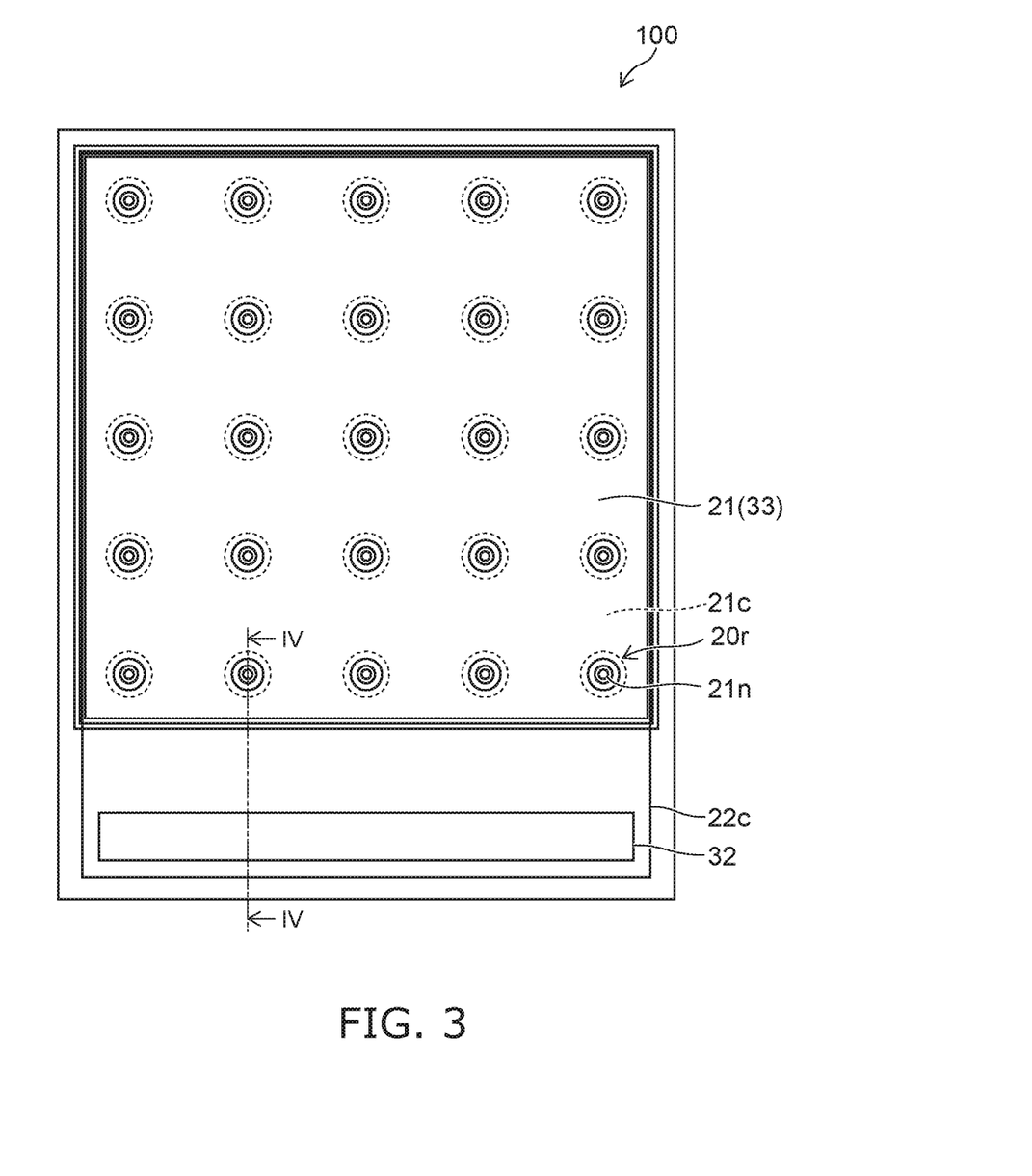
FIG. 3 is a plan view illustrating the semiconductor light-emitting device manufactured using the method for manufacturing the semiconductor device according to the first embodiment of the invention.

FIG. 3 is a plan view illustrating the semiconductor light-emitting device manufactured using the method for manufacturing the semiconductor device according to the first embodiment of the invention.

Figure 4:
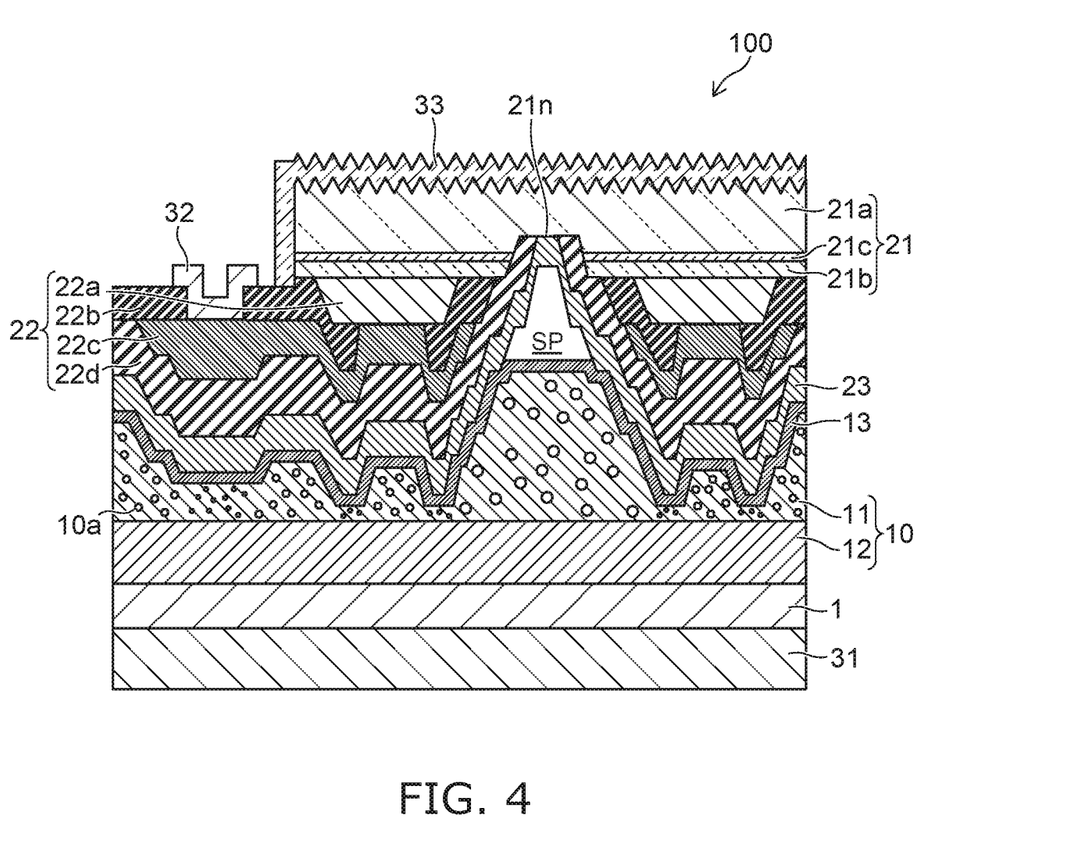
FIG. 4 is a IV-IV cross-sectional view of FIG. 3.

FIG. 4 is a IV-IV cross-sectional view of FIG. 3.

In addition to the structure shown in FIG. 2B, the semiconductor light-emitting device 100 illustrated in FIG. 3 and FIG. 4 further includes a back surface electrode 31, a p-pad electrode 32, and a protective layer 33.

As shown in FIG. 3, the multiple concave portions 20r are provided in a matrix configuration in the semiconductor stacked body 21. The interconnect layer 22c is provided to extend from the region where the semiconductor stacked body 21 is provided; and the p-pad electrode 32 is provided at a portion of the extended portion. That is, the p-pad electrode 32 is provided outside the region where the semiconductor stacked body 21 is provided.

As shown in FIG. 4, the back surface electrode 31 is provided at the lower surface of the semiconductor light-emitting device 100 (the surface of the substrate 1 on the side opposite to the metal layer 10). The p-pad electrode 32 is provided to be separated from the semiconductor stacked body 21 on the upper surface of the semiconductor light-emitting device 100. As shown in FIG. 4, the p-pad electrode 32 is connected to the interconnect layer 22c exposed at the insulating layer 22b. The protective layer 33 covers the surface of the semiconductor stacked body 21. An uneven structure or the like may be formed at the upper surface of the n-type semiconductor layer 21a to improve the light extraction efficiency of the semiconductor light-emitting device 100.

By using the manufacturing method according to the embodiments described above, a semiconductor light-emitting device 100 that has the following configuration may be manufactured.

The first metal portion 11 has multiple pores 10a. A first part of the first metal portion 11 overlaps the concave portion 20r of the first surface 20S in the vertical direction. In the vertical direction, a second part of the first metal portion 11 overlaps a surface of the first surface 20S at a location other than where the concave portion 20r is provided. The average diameter of the pores 10a in the second part of the first metal portion 11 is smaller than the average diameter of the pores 10a in the first part of the first metal portion 11. Also, the density of the pores 10a in the second part of the first metal portion 11 is lower than the density of the pores 10a in the first part of the first metal portion 11.

In the case in which the multiple second metal portions 12 including the first metal and the second metal are provided inside the first metal portion 11, the average diameter of the second metal portions 12 in the other portion of the first metal portion 11 is smaller than the average diameter of the second metal portions 12 in the portion of the first metal portion 11. Also, the density of the second metal portions 12 in the other portion of the first metal portion 11 is lower than the density of the second metal portions 12 in the portion of the first metal portion 11.

The embodiments described above are examples embodying the invention, and the invention is not limited to these embodiments. Embodiments obtained by appropriate design modifications of the embodiments described above made by one skilled in the art also are within the scope of the invention to the extent that the spirit of the invention is included.

What is claimed is:

1. A method for manufacturing a semiconductor device, the method comprising:
   preparing a structure body comprising a semiconductor stacked body, wherein a first surface of the structure body comprises a concave portion;
   forming a first metal portion on a substrate, the first metal portion comprising a plurality of pores; and
   after forming the first metal portion on the substrate, bonding the first metal portion to the structure body, such that:
      the first metal portion is located between the structure body and the substrate,
      a first part of the first metal portion is bonded to the concave portion of the first surface, and a second part of the first metal portion is bonded to a part of the first surface other than the concave portion,
      the first metal portion is bonded to the first surface such that at least a portion of the concave portion is filled with the first metal portion, and
      an average diameter of a plurality of the pores in the second part of the first metal portion is smaller than an average diameter of a plurality of the pores in the first part of the first metal portion.

2. The method according to claim 1, further comprising:
   before forming the first metal portion on the substrate, forming a metal layer on a substrate, the metal layer comprising a first metal and a second metal;
   wherein, in forming the first metal portion on the substrate, the first metal portion is formed from the first metal by removing the second metal in at least a portion of the metal layer.

3. The method according to claim 2, wherein:
   a second metal portion is formed from the metal layer, the second metal layer portion comprising the first metal and the second metal; and
   a thickness of the first metal portion is greater than a thickness of a second metal portion of the metal layer.

4. The method according to claim 3, wherein:
   in bonding the first metal portion to the structure body, the second metal portion is filled into at least a portion of the pores of the first metal portion by melting the second metal portion.

5. The method according to claim 2, wherein:
   a thickness of the metal layer is greater than a depth of the concave portion.

6. The method according to claim 2, wherein:
   the first metal is at least one selected from the group consisting of gold, silver, nickel, and chrome; and
   the second metal is tin.

7. The method according to claim 1, wherein:
   a thickness of the first metal portion is greater than a depth of the concave portion.

8. The method according to claim 2, wherein:
   a thickness of the first metal portion is greater than a depth of the concave portion.

9. The method according to claim 3, wherein:
   a thickness of the first metal portion is greater than a depth of the concave portion.

10. The method according to claim 1, wherein:
    in bonding the first metal portion to the structure body, a space is formed and surrounded by the first surface and the first metal portion at the concave portion by filling a portion of the concave portion with the first metal portion.

11. The method according to claim 2, wherein:
    in bonding the first metal portion to the structure body, a space is formed and surrounded by the first surface and the first metal portion at the concave portion by filling a portion of the concave portion with the first metal portion.

12. The method according to claim 3, wherein:
    in bonding the first metal portion to the structure body, a space is formed and surrounded by the first surface and the first metal portion at the concave portion by filling a portion of the concave portion with the first metal portion.

13. The method according to claim 10, wherein:
    a pressure in the space is less than atmospheric pressure.

14. The method according to claim 1, wherein:
    the semiconductor stacked body comprises an n-type semiconductor layer, a p-type semiconductor layer, and a light-emitting layer located between the n-type semiconductor layer and the p-type semiconductor layer; and
    in a plan view, the p-type semiconductor layer and the light-emitting layer are provided at a surface of the n-type semiconductor layer overlapping a region where the concave portion is not located.

15. The method according to claim 2, wherein
    the semiconductor stacked body comprises an n-type semiconductor layer, a p-type semiconductor layer, and a light-emitting layer located between the n-type semiconductor layer and the p-type semiconductor layer; and
    in a plan view, the p-type semiconductor layer and the light-emitting layer are provided at a surface of the n-type semiconductor layer overlapping a region where the concave portion is not located.

16. The method according to claim 3, wherein
    the semiconductor stacked body comprises an n-type semiconductor layer, a p-type semiconductor layer, and a light-emitting layer located between the n-type semiconductor layer and the p-type semiconductor layer; and
    in a plan view, the p-type semiconductor layer and the light-emitting layer are provided at a surface of the n-type semiconductor layer overlapping a region where the concave portion is not located.

17. The method according to claim 14, wherein:
    an electrically conductive layer is located along the first surface of the structure body and electrically connected to the n-type semiconductor layer; and
    in bonding the first metal portion to the structure body, the first metal portion and the electrically conductive layer are bonded.

18. A method for manufacturing a semiconductor device, the method comprising:
    forming a metal layer on a substrate, the metal layer comprising a first metal and a second metal
    after forming the metal layer on the substrate, removing the second metal in a portion of the metal layer, thereby forming on the substrate:
       a first metal portion formed from the first metal, the first metal portion comprising a plurality of pores, and
       a second metal portion formed from the first metal and the second metal,
    wherein a thickness of the first metal portion is greater than a thickness of the second metal portion;

preparing a structure body comprising a semiconductor stacked body, wherein a first surface of the structure body comprises a concave portion; and bonding the first metal portion to the structure body, such that:

a first part of the first metal portion is bonded to the concave portion of the first surface, and a second part of the first metal portion is bonded to a part of the first surface other than the concave portion;

the first metal portion is bonded to the first surface such that at least a portion of the concave portion is filled with the first metal portion, and an average diameter of a plurality of the pores in the second part of the first metal portion is smaller than an average diameter of a plurality of the pores in the first part of the first metal portion.

19. A method for manufacturing a semiconductor device, the method comprising:

forming a first metal portion on a substrate, the first metal portion comprising a plurality of pores;

preparing a structure body comprising a semiconductor stacked body, wherein a first surface of the structure body comprises a concave portion; and bonding the first metal portion to the structure body, such that:

a first part of the first metal portion is bonded to the concave portion of the first surface, and a second part of the first metal portion is bonded to a part of the first surface other than the concave portion, the first metal portion is bonded to the first surface such that a portion of the concave portion is filled with the first metal portion, and a space is formed and surrounded by the first surface and the first metal portion at the concave portion, and an average diameter of a plurality of the pores in the second part of the first metal portion is smaller than an average diameter of a plurality of the pores in the first part of the first metal portion.

\* \* \* \* \*

UNITED STATES PATENT AND TRADEMARK OFFICE
CERTIFICATE OF CORRECTION

PATENT NO. : 10,892,392 B2
APPLICATION NO. : 16/555648
DATED : January 12, 2021
INVENTOR(S) : Kyota Sugitani Page 1 of 1

It is certified that error appears in the above-identified patent and that said Letters Patent is hereby corrected as shown below:

Claim 3, Column 9, Line 40:
Please delete:
"second metal layer portion comprising the first metal"

Please replace with:
"second metal portion comprising the first metal"

Signed and Sealed this
Second Day of March, 2021

Drew Hirshfeld
*Performing the Functions and Duties of the
Under Secretary of Commerce for Intellectual Property and
Director of the United States Patent and Trademark Office*